United States Patent [19]

Barrett, Jr. et al.

[11] Patent Number: 5,337,007

[45] Date of Patent: Aug. 9, 1994

[54] HIGH EFFICIENCY CLASS AB TRANSCONDUCTANCE AMPLIFIER

[75] Inventors: Raymond L. Barrett, Jr., Ft. Lauderdale; Barry W. Herold, Boca Raton, both of Fla.

[73] Assignee: Motorola, Inc., Schaumburg, Ill.

[21] Appl. No.: 147,235

[22] Filed: Nov. 4, 1993

[51] Int. Cl.$^5$ ............................................. H03F 3/45
[52] U.S. Cl. .................................. 330/253; 330/252; 330/255; 330/257; 330/261; 330/311
[58] Field of Search ................ 330/252, 253, 255, 257, 330/261, 311

[56] References Cited

U.S. PATENT DOCUMENTS 4,958,133  9/1990  Bazes .................................. 330/255

OTHER PUBLICATIONS

Gregorian and Temes, Analog MOS Integrated Circuits for Signal Processing, High Performance CMOS OP-Amps, 1986, pp. 251-257.

Primary Examiner—James B. Mullins
Assistant Examiner—J. Dudek
Attorney, Agent, or Firm—Keith A. Chanroo; Thomas G. Berry

[57] ABSTRACT

A class AB transconductance amplifier (200) has first and second differential input amplifier stages (100-112) adapted for receiving first and second differential input signals (Vin+, Vin−). First and second input cascode stages are coupled to the first and second differential input amplifier stages for providing first and second differential folded cascode signals. An output stage (113-118) is coupled to the first and second differential folded cascode signals providing an output signal indicative of a difference between the first and second differential input signals (Vin+, Vin−). A bias stage (101, 102) is coupled to said first and second differential input amplifier stages (103-104, 105-106) and the first and second input cascode stages bias the first and second differential input amplifier stages (100-112) to operate as a class AB folded cascode amplifier circuit (200). The bias stage generates class AB biasing signals.

6 Claims, 1 Drawing Sheet

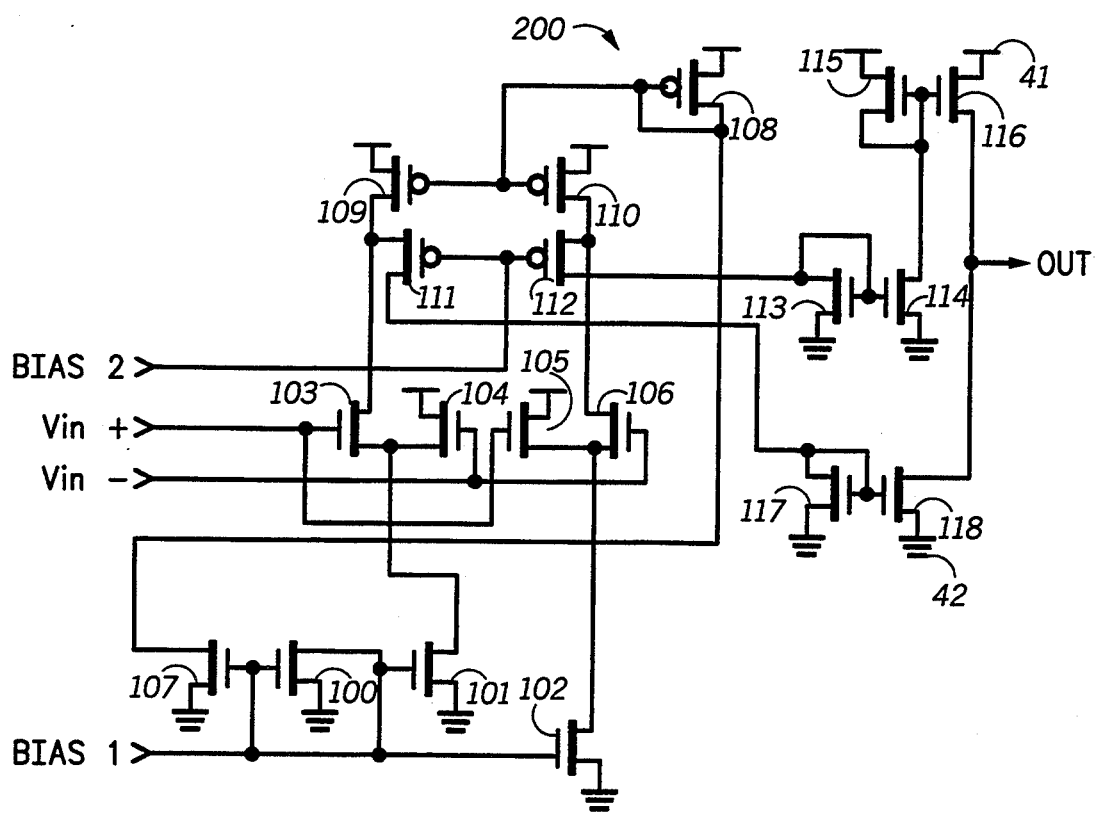

HIGH EFFICIENCY CLASS AB TRANSCONDUCTANCE AMPLIFIER

FIELD OF THE INVENTION

This invention relates generally to electronic circuits, and more particularly to a high efficiency class AB transconductance amplifier.

BACKGROUND OF THE INVENTION

Operational amplifiers are widely used in the electronics industry because of their many excellent circuit characteristics including high open loop gain, high input impedance, and low output impedance. Operational transconductance amplifiers, are similar to the operational amplifiers generally, but exhibit high output impedance. General applications of operational amplifiers include circuit configurations such as voltage and current amplifiers, differentiators and integrators, active filters, oscillators, and analog-to-digital and digital-to-analog converters. To realize these different circuit configurations, operational amplifiers are used in conjunction with positive and/or negative feedback in combination with passive and/or active elements.

Operational amplifiers are also widely used to function as voltage comparators, wherein typically, a reference signal is applied to the inverting input, and the voltage to be compared is applied to the non-inverting input. If the magnitude of the voltage to be compared is greater than the magnitude of the reference signal, the output of the comparator equals the positive supply voltage. If the magnitude of the voltage to be compared is less than the magnitude of the reference voltage, the output of the comparator equals the negative or ground supply voltage. An inverted voltage comparator may be provided by simply transposing the signals at the inverting and non-inverting inputs. Using the operational amplifier as a voltage comparator requires no external components or feedback, and its output only has two states of high and low.

The operational amplifier as utilized in the realization of a variety of circuit functions may be manufactured in bipolar or Complementary Metal Oxide Semiconductor (CMOS) technology or some combination thereof. The CMOS implementation is desirable for its low power consumption characteristic. Also, operational amplifiers are increasingly being integrated onto chips that merge digital and analog functions together with an increasing number of devices.

Operational amplifiers are biased and connected to operate with different characteristics, for example Class A, Class B, or Class AB amplifiers; the operations of which are well known to one of ordinary skill in the art. Specifically, for example the Class AB operational amplifier requires bias voltage and current to set the operating point of the amplifier. As a result, additional circuitry has to be incorporated therein to provide the proper bias voltage magnitudes. Still further, the class AB operational amplifiers require large asymmetric differential inputs to generate asymmetrical bias currents flow through the amplifier. This large asymmetric bias current causes an undesirably high common mode current, internal to the operational amplifier circuitry, which might flow depending upon the given circuit application. Unfortunately, the undesirably high common mode current causes a drain of battery power, which for many applications, such as in radio pagers, is to be avoided since battery life is a major design concern.

Thus, what is needed is a class AB transconductance amplifier that does not require additional circuitry for generating large asymmetrical bias conditions which drains battery power because of the high common mode current flowing as a result of the operating point of the transconductance amplifier.

SUMMARY OF THE INVENTION

A class AB transconductance amplifier comprises first and second differential input amplifier stages adapted for receiving first and second differential input signals. First and second input cascode stages are coupled to the first and second differential input amplifier stages for providing first and second differential folded cascode signals. An output stage is coupled to the first and second differential folded cascode signals providing an output signal indicative of a difference between the first and second differential input signals. A bias stage is coupled to the first and second differential input amplifier stages and the first and second input cascode stages bias the first and second differential input amplifier stages to operate as a class AB folded cascode amplifier circuit. The bias stage generates class AB biasing signals.

BRIEF DESCRIPTION OF THE DRAWING

FIG. 1 is a schematic diagram of a class AB transconductance amplifier in accordance with a preferred embodiment of the present invention.

DESCRIPTION OF A PREFERRED EMBODIMENT

FIG. 1 illustrates a class AB folded cascode transconductance amplifier 200 having transistors 100 through 112 operating as a folded cascode differential input stage. The folded cascode differential input stage comprises transistors 103, 104, 109, and 111 with an additional second stage that comprises transistors 105, 106, 110, and 112. The folded cascode differential input stage 103–106 and 109–112 is biased to provide a small "push" bias current in transistor 112 and a small "pull" bias current in transistor 111. The remaining Metal Oxide Semiconductor (MOS) transistor circuit comprises MOS transistors 113 through 118 that provide a converted single output current proportional to the difference of the current outputs of transistors 111 and 112.

An external input current, BIAS 1, is provided to establish a reference voltage equal to a gate-to-source voltage (Vgs) of Negative Metal Oxide Semiconductor (NMOS) transistor 100 at the value of the external input current, BIAS 1. Also, NMOS transistors 101, 102, and 107 are constrained to share the same Vgs with the NMOS transistor 100, each having the same magnitude current proportional to the input current as determined by their respective geometries. The class AB folded cascode transconductance amplifier is bias by voltage supplies 41, 42.

The transistors 103 and 104 are connected as a differential input pair sharing the current in transistor 101, and transistors 105 and 106 are also connected as a differential pair sharing the current in transistor 102 thereby providing the same common mode drain currents and differential mode drain currents in each pair of transistors. A bias voltage, BIAS 2, is provided by an external bias circuit (not shown), well known to one of ordinary skill in the art, for biasing the cascode pair of transistors 111 and 112.

The portion of circuit comprising transistor 108 and an identical transistor pair 109 and 110 functions as a current mirror circuit with two identical output currents. The output currents are determined by the geometries of the transistor devices that are designed such that the sum of the drain currents in Positive Metal Oxide Semiconductor (PMOS) transistors 109 and 110 is greater than the drain current in the NMOS transistor 101 (or the NMOS transistor 102 that has the same characteristic). The sum of the drain currents is greater than the common mode drain currents flowing in the transistors 103 through 104 and the transistors 105 through 106. In this way, any value of current can be chosen as long as the sum is greater than the common mode drain current. More particularly, a useful effect, to be discussed in detail below, can be achieved when the excess current is only a small percentage, for example ten-percent (10%) or less, of the common mode drain current.

The mirror current, the common mode drain current, and the differential mode drain current are summed at the junction of the drain of transistor 109, the source of transistor 111, and the drain of transistor 103; and similarly, at the junction of the drain of transistor 110, the source of transistor 112, and the drain of transistor 106 with the remaining excess current difference flowing through the "pull" transistor 111 and the "push" transistor 112 to an output, OUT. Also, because the mirror current is proportional to and exceeds the common mode drain current in the differential pairs of transistors 103-104 and 105-106, the excess common mode drain current established in transistors 111 and 112 causes the class AB folded cascode transconductance amplifier 200 to operate as a Class A amplifier for small signals.

According to the preferred embodiment of the present invention, by selectively connecting the input differential pairs 103-104, and 105-106 to the current mirror 107 through 110 and connecting the remaining side of each differential pair to the power supply 41, 42, a novel behavior for large signal differential operation is achieved. This novel behavior occurs when a large differential signal is applied to the input nodes, Vin+ and Vin−, the common mode drain current generated in each differential NMOS transistor pair 103-104 or 105-106 is proportioned between the NMOS transistors forming each NMOS differential transistor pair. However, the sum of common mode drain current is limited to the common mode bias current, $I_{BIAS}$. This limitation is achieved by an asymmetrical connection of each differential transistor pair 103-104 or 105-106 causing one side of the differential transistor pair to be limited by the current mirror 107-109 while the other side of the differential transistor pair is limited by the maximum common mode drain current, $I_{CM}$. The side of the differential transistor pair that is connected to the current mirror can be totally deprived of current via the differential transistor pair thereby establishing a minimum current value, for example zero (0) micro-Amperes, while the entire current flows through the current mirror to the output, OUT. Moreover, since that NMOS transistor is limited to the current in the current mirror (less than the common mode bias value), a difference of zero (0) micro-Amperes can remain to be conducted through the cascode device.

In this way, the addition of a second input differential stage allows asymmetrical current to flow to the output establishing a separate bias condition for the output. Specifically, the two input stages are biased from transistors 101 and 102 providing a common mode drain current, $I_{CM}$, and a differential mode drain current, $I_{DM}$, in each of the differential pair 103-104 and 105-106. The common mode currents, $I_{CM}$, are the same in each differential transistor pair. However, due to the interconnection therebetween, the transistor 103 causes the differential mode current, $I_{DM}$, to flow. The differential mode current in transistor 103 must be out of phase with the differential mode current flowing through the transistor 106. To achieve this, the bias conditions are chosen for the circuit such that nearly all the current that splits through transistors 103, 104 and through transistor 105, 106 is accounted for by the current flowing in transistors 109 and 110, respectively. In addition, transistors 109 and 110 have small additional incremental current flow through transistors 111 and 112, respectively. That incremental current flow is used at the output stage to bias the output. The small currents provide class A operation for signals which modulate those values from their bias value (quiescent value) down to zero and up to twice the quiescent value, respectively. Accordingly, the average current flowing in transistor 116 equals the average current flowing in transistor 118, which causes class A operation of the class AB folded cascode transconductance amplifier 200 for very small signals.

Therefore, the difference between the two currents flows to the output, OUT, comprises the differential mode current because the common mode currents cancel. The differential pairs, being asymmetrically connected to the power supply referencing transistors 104 and 105, could take the entire value of the current, $I_{BIAS}$, when the transistor 104 is conducting. This causes the transistor 103 to shut off allowing all the current from transistor 109 to flow to transistor 111 producing substantially larger output currents to one side of the output circuit.

When transistor 103 is shut "off" and transistor 104 is turned "on", as was previously described, transistor 106 is also turned "on". As transistor 106 is turned "on", it can take all the current of transistor 110 leaving nothing (zero current) to go through transistor 112. Transistor 112 therefore shuts "off". This is a classical type B operation in which one side is "on", the other side "off". As is well known, the class B operation does not have both sides "on" at the same time resulting in an average current flowing through the two sides. In this fashion, for large signals, the circuit essentially operates as a class B amplifier and for small signals to large signals operation. The circuit operation moves from a class A operation to the class B operation which is, as is well known, the definition of class AB amplifier operation. While the operation of the class AB amplifier is well known, the novelty of this circuit is achieved by shifting the typical class AB bias from the output stage to the input stage. With the class AB amplifier bias moved all the way to the input stage, the asymmetrical current flows all the way through and the need to generate large average values of bias current for the circuit is eliminated.

The conventional class AB amplifier has a class A input stage and a class AB output stage which requires additional circuitry to convert the class A input stage into a class AB stage. According to the invention, the efficiency of the class AB amplifier is increased by avoiding the additional circuitry required to convert the input stage from class A to class AB by shifting the class AB bias from the output stage to the input stage. With the class AB input stage, an asymmetrical current flows all the way through the circuit and the need to generate large average value of bias current for the circuit is eliminated. Also, the sum of common mode drain current is limited to the common mode bias current, $I_{BIAS}$. This is achieved by the asymmetrical connection of each differential transistor pair 103-104 or 105-106 causing one side of the differential transistor pair to be limited by the current mirror 107-110 while the other side of the differential transistor pair is limited by the maximum common mode drain current, $I_{CM}$. Accordingly, a limitation is placed on the high common mode current that can flow through the transconductance amplifier.

In summary, a class AB transconductance amplifier comprises first and second differential input amplifier stages adapted for receiving a first and second differential input signals. First and second input cascode stages are coupled to the first and second differential input amplifier stages providing first and second differential folded cascode signals. The first and second input cascode stages comprise a current mirror. The current mirror receives class AB biasing signals for setting a common mode current. First and second folded transistors generate a differential current. The first and second folded transistors also receive the class AB biasing signals. An output stage is coupled to the first and second differential folded cascode signals which provides an output signal indicative of a difference between the first and second differential input signals. The output stage receives the differential current from the first and second folded transistors, respectively, and converts the differential current into a single output current proportional thereto. A bias stage is coupled to said first and second differential input amplifier stages and the first and second input cascode stages for biasing the first and second differential input amplifier stages to operate as a class AB folded cascode amplifier circuit. The bias stage generates the class AB biasing signals.

What is claimed is:

1. A class AB transconductance amplifier, comprising:
   first and second differential input amplifier stages adapted for receiving first and second differential input signals;
   first and second input cascode stages coupled to said first and second differential input amplifier stages for providing first and second differential folded cascode signals;
   an output stage coupled to the first and second input cascode stages for providing an output signal indicative of a difference between the first and second differential input signals; and
   a bias stage coupled to said first and second differential input amplifier stages and said first and second input cascode stages for biasing the first and second differential input amplifier stages to operate as a class AB folded cascode amplifier circuit, said bias stage generating class AB biasing signals.

2. The class AB transconductance amplifier according to claim 1, wherein the first and second input cascode stages comprise a current mirror, the current mirror receiving the class AB biasing signals for setting a common mode current.

3. The class AB transconductance amplifier according to claim 2, wherein the first and second input cascode stages comprise first and second folded transistors for generating a differential current, the first and second folded transistors receiving the class AB biasing signals.

4. The class AB transconductance amplifier according to claim 2, wherein the first and second input cascode stages comprise first and second folded transistors for generating a differential current, the first and second folded transistors being biased by class AB biasing signals.

5. The class AB transconductance amplifier according to claim 4 wherein the output stage receives the differential current from the first and second folded transistors, respectively, and converts the differential current into a single output current proportional thereto.

6. A class AB transconductance amplifier, comprising:
   first and second differential input amplifier stages adapted for receiving first and second differential input signals;
   first and second input cascode stages coupled to said first and second differential input amplifier stages for providing first and second differential folded cascode signals, said first and second input cascode stages comprise:
   a current mirror, the current mirror receiving a class AB biasing signals for setting a common mode current; and
   first and second folded transistors for generating a differential current, the first and second folded transistors receiving the class AB biasing signals;
   an output stage coupled to the first and second input cascode stages for providing an output signal indicative of a difference between the first and second differential input signals, said output stage receives the differential current from the first and second folded transistors, respectively, and converts the differential current into a single output current proportional thereto; and
   a bias stage coupled to said first and second differential input amplifier stages and said first and second input cascode stages for biasing the first and second differential input amplifier stages to operate as a class AB folded cascode amplifier circuit, said bias stage generating the class AB biasing signals.

* * * * *